(12) United States Patent
Quercia et al.

(10) Patent No.: US 12,288,961 B2
(45) Date of Patent: Apr. 29, 2025

(54) ELECTRONIC DEVICE COMPRISING A TRANSPARENT ENCAPSULATION STRUCTURE HOUSING AN ELECTRONIC CHIP AND CORRESPONDING PRODUCTION METHOD

(71) Applicant: STMicroelectronics (Grenoble 2) SAS, Grenoble (FR)

(72) Inventors: Fabien Quercia, Isere (FR); Jean-Michel Riviere, Froges (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 1032 days.

(21) Appl. No.: 17/223,649

(22) Filed: Apr. 6, 2021

(65) Prior Publication Data
US 2021/0320473 A1    Oct. 14, 2021

(30) Foreign Application Priority Data

Apr. 8, 2020    (FR) ........................................ 2003539

(51) Int. Cl.
| | |
|---|---|
| H01S 5/02234 | (2021.01) |
| G01S 7/481 | (2006.01) |
| H01L 31/0203 | (2014.01) |
| H01L 31/0232 | (2014.01) |
| H01S 5/00 | (2006.01) |

(Continued)

(52) U.S. Cl.
CPC ........ *H01S 5/02234* (2021.01); *G01S 7/4815* (2013.01); *H01L 31/0203* (2013.01); *H01L 31/02325* (2013.01); *H01S 5/0078* (2013.01); *H01S 5/0236* (2021.01); *H01S 5/4031* (2013.01)

(58) Field of Classification Search
None
See application file for complete search history.

(56) References Cited

U.S. PATENT DOCUMENTS

| | | | |
|---|---|---|---|
| 10,422,877 B2 * | 9/2019 | Halliday | ........... H01L 31/02325 |
| 2004/0211881 A1 | 10/2004 | Liu | |

(Continued)

FOREIGN PATENT DOCUMENTS

| | | |
|---|---|---|
| CN | 105448939 A | 3/2016 |
| CN | 110556368 A | 12/2019 |

(Continued)

OTHER PUBLICATIONS

NPI Search Report and Written Opinion for FR 2003539 dated Nov. 23, 2020 (10 pages).

(Continued)

*Primary Examiner* — Eric L Bolda
(74) *Attorney, Agent, or Firm* — Crowe & Dunlevy LLC (57) ABSTRACT

An electronic device includes a base substrate having a mounting face. An electronic chip is fastened onto the mounting face of the base substrate. A transparent encapsulation structure is bonded onto the base substrate. The transparent encapsulation structure includes a housing with an internal cavity defining a chamber housing the electronic chip. The encapsulation structure has an external face that supports a light-filtering optical wafer located facing an optical element of the electronic chip. An opaque cover covers the transparent encapsulation structure and includes a local opening facing the light-filtering optical wafer.

26 Claims, 3 Drawing Sheets

(51) Int. Cl.
*H01S 5/0236* (2021.01)
*H01S 5/40* (2006.01)

(56) References Cited

U.S. PATENT DOCUMENTS

| | | |
|---|---|---|
| 2013/0292705 A1 | 11/2013 | Makimura et al. |
| 2015/0115138 A1 | 4/2015 | Heng et al. |
| 2016/0041029 A1* | 2/2016 | T'Ng .................... G01S 17/04 |
| | | 250/239 |
| 2016/0126403 A1 | 5/2016 | Tu et al. |
| 2016/0146639 A1 | 5/2016 | Chan |
| 2018/0301585 A1 | 10/2018 | Fujimoto |
| 2019/0137332 A1 | 5/2019 | Chu et al. |
| 2019/0196546 A1 | 6/2019 | Wu |
| 2019/0207051 A1 | 7/2019 | Utsumi |
| 2021/0399518 A1* | 12/2021 | Schwarz ............ H01S 5/02234 |
| 2022/0003866 A1* | 1/2022 | Maeda .................. G01S 7/4863 |

FOREIGN PATENT DOCUMENTS

| | | |
|---|---|---|
| CN | 215496711 U | 1/2022 |
| JP | 07239380 A | 9/1995 |
| JP | 2015088518 A | 5/2015 |

OTHER PUBLICATIONS

CN First Office Action and Search Report for counterpart CN Appl. No. 202110373974.4, report dated Nov. 8, 2024, 15 pgs.

\* cited by examiner

ELECTRONIC DEVICE COMPRISING A TRANSPARENT ENCAPSULATION STRUCTURE HOUSING AN ELECTRONIC CHIP AND CORRESPONDING PRODUCTION METHOD

PRIORITY

This application claims the priority benefit of French Application for Patent No. 2003539, filed on Apr. 8, 2020, the content of which is hereby incorporated by reference in its entirety to the maximum extent allowable by law.

TECHNICAL FIELD

Embodiments and implementations of the invention relate to the field of microelectronics and more particularly the field of packaging of electronic devices comprising electronic integrated circuit chips which integrate optical elements.

BACKGROUND

Conventional electronic devices comprise electronic integrated circuit (IC) chips which integrate optical elements embedded in a transparent resin layer distributed on the surface of a base substrate.

The transparent resin layer typically supports optical wafers forming optical assemblies with the integrated optical elements.

During conventional productions of electronic devices, several electronic integrated circuit chips are fastened onto the same substrate, they are embedded in the transparent resin layer then they are subsequently separated from the other electronic integrated circuit chips of the substrate.

To separate the electronic chips, the transparent resin layer is cut, for example using a saw. Each resin block then encapsulates a single electronic chip and the associated optical element thereof.

Such arrangements have problems insofar as each resin block may have uncertainties of shape stemming from the production method used, compromising a precise assembly particularly of encapsulation covers on the resin blocks, or indeed optical assemblies formed by the integrated optical elements and the optical wafers.

Indeed, a gap between the transparent resin and the cover can be formed, for example after heat treatments.

Furthermore, the resin blocks can, for example, have shape defects due to poor alignment and/or wear of the saw cutting the resin layer.

Thus, it is desirable to reduce the production uncertainties of transparent elements encapsulating the electronic chips integrating optical elements.

SUMMARY

According to an aspect, an electronic device comprises: a base substrate having a mounting face; at least one electronic chip including a rear face fastened onto the mounting face of the base substrate, and integrating an optical element on a front face of said at least one electronic chip; a transparent encapsulation structure bonded onto the base substrate, comprising at least one housing including an internal cavity defining a chamber housing said at least one electronic chip, and supporting a light-filtering optical wafer located facing each optical element on an external face of the encapsulation structure; and an opaque cover covering the transparent encapsulation structure, and including a local opening located facing each optical wafer.

Thus, the shape and the optical properties of the transparent encapsulation structure can be controlled upstream from the bonding on the base substrate. The encapsulation structure also makes it possible to hold the light-filtering optical wafer on the external face of the encapsulation structure, the position and shape of which can be controlled upstream from the bonding on the base substrate.

Consequently, the problems of conventional techniques such as saw alignment or saw wear are not incurred, and the structure of the electronic device is better controlled. Moreover, the opaque cover makes it possible to cover the transparent encapsulation structure such that only each light-filtering optical wafer allows light entering inside the chamber and from outside the chamber to pass, and vice versa. Similarly, the opaque cover can have a controlled shape before covering the transparent encapsulation structure.

According to an embodiment, the transparent encapsulation structure is provided with a hollowed front recess located on an external face of the encapsulation structure facing each optical element and receiving the light-filtering optical wafer.

In other words, the hollowed front recess in the encapsulation structure makes it possible to hold the optical wafer in a fixed position on the external face of the encapsulation structure.

According to an embodiment, said at least one electronic chip includes a first electronic chip and a second electronic chip, the device further including an opaque partition between the first electronic chip and the second electronic chip.

The opaque partition thus makes it possible advantageously to prevent an optical path between a first optical element of the first electronic chip and a second optical element of the second electronic chip.

According to an embodiment, said at least one housing includes a single transparent housing defining a single chamber housing the first electronic chip and the second electronic chip, and the opaque partition comprises an opaque adhesive volume located inside the chamber.

Thus, a single chamber then houses the first electronic chip and the second electronic chip, and it is the opaque adhesive volume that makes it possible to prevent a direct optical path inside the chamber between the first optical element of the first electronic chip and the second optical element of the second electronic chip.

According to a further embodiment, said at least one housing includes a first transparent housing defining a first chamber housing the first electronic chip, and a second transparent housing defining a second chamber housing the second electronic chip, a median space outside the chambers spacing the first chamber and the second chamber.

Thus, the relative position of the first chamber with respect to the second chamber is free and the median space between the first chamber and the second chamber makes it possible that no waveguide is formed between the first and the second chamber.

According to a further embodiment, said at least one housing includes a single transparent housing defining a first chamber housing the first electronic chip, and a second chamber housing the second electronic chip, a median space outside the chambers spacing the first chamber and the second chamber, the housing comprising a planar portion connecting the chambers and resting on the base substrate.

Thus, the relative position of the first chamber with respect to the second chamber is constrained by dimensions of the planar portion connecting the two chambers, this makes it possible to position the first chamber precisely with respect to the second chamber.

According to an embodiment, the base substrate includes a recess hollowed in the mounting face of the base substrate and containing the planar portion of the housing.

Advantageously, the recess hollowed in the mounting face of the base substrate makes it possible that the planar portion of the housing does not form an optical path between the first chamber and the second chamber.

The opaque cover can include, or not, the opaque partition optically separating the first chamber and the second chamber.

According to an embodiment, the opaque cover incorporates the opaque partition inserted into the median space between the first chamber and the second chamber.

According to a further embodiment, the opaque partition fills the median space between the first chamber and the second chamber and the opaque cover is bonded to a free top face of the opaque partition.

According to a further embodiment, the opaque cover and the opaque partition comprise an opaque material sputtered onto the external faces of the transparent encapsulation structure.

According to an embodiment, the optical element integrated in the first electronic chip includes a radiation emitter and the optical element integrated in the second electronic chip includes a radiation receiver, the optical element integrated in the second electronic chip being intended to receive the radiation emitted by the optical element integrated in the first electronic chip after reflection onto an external element.

According to a further aspect, a method for producing an electronic device, comprises: fastening a rear face of at least one electronic chip integrating an optical element on a front face, onto a mounting face of a base substrate; bonding, on the mounting face of the substrate, a transparent encapsulation structure including at least one housing including an internal cavity defining a chamber such that each chamber houses said at least one electronic chip; mounting a light-filtering optical wafer onto the transparent encapsulation structure facing each integrated optical element; mounting an opaque cover covering the encapsulation structure so as to locate a local opening of the opaque cover facing each integrated optical element.

According to an implementation, the light-filtering optical wafer is mounted in a hollowed front recess located on an external face of the encapsulation structure facing each optical element and envisaged to receive the optical wafer.

According to an implementation, said at least one electronic chip includes a first electronic chip and a second electronic chip, the bonding of the encapsulation structure comprising a placing of an opaque partition between the first electronic chip and the second electronic chip.

According to an implementation, said at least one housing defines a single chamber, the bonding of the encapsulation structure comprising a housing in the chamber of the first electronic chip and the second electronic chip, and the placing of the opaque partition comprises a formation of an opaque adhesive volume between the first electronic chip and the second electronic chip.

According to an implementation, said at least one housing includes a first transparent housing defining a first chamber and a second transparent housing defining a second chamber, the bonding of the transparent encapsulation structure comprising an arrangement of the first housing and the second housing so as to house the first electronic chip in the first chamber and the second electronic chip in the second chamber, and leave a median space outside the chambers spacing the first chamber and the second chamber.

According to an implementation, said at least one housing includes a single transparent housing defining a first chamber and a second chamber, a median space outside the chambers spacing the first chamber and the second chamber, the housing comprising a planar portion connecting the chambers, the bonding of the encapsulation structure comprising a housing of the first electronic chip in the first chamber and of the second electronic chip in the second chamber, and a positioning of the planar portion on the base substrate.

According to an implementation, the method further comprises: forming a hollow recess in the mounting face intended to contain the planar portion of the housing, and the planar portion is positioned in the hollow recess of the mounting face.

According to an implementation, the placing of the opaque partition comprises inserting an opaque partition incorporated in the opaque cover in the median space between the first transparent chamber and the second transparent chamber.

According to an implementation, the placing of the opaque partition comprises filling the median space between the first chamber and the second chamber with an opaque material, followed by bonding the opaque cover onto a free top face of the opaque partition.

According to an implementation, the mounting of the opaque cover on the encapsulation structure and the placing of the opaque partition comprise sputtering an opaque material onto the external faces of the transparent encapsulation structure.

According to mode of execution, the optical element integrated in the first electronic chip includes a radiation emitter and the optical element integrated in the second electronic chip includes a radiation receiver, the optical element integrated in the second electronic chip being intended to receive the radiation emitted by the optical element integrated in the first electronic chip after reflection onto an external element.

BRIEF DESCRIPTION OF THE DRAWINGS

Further advantages and features of the invention will emerge on studying the detailed description of embodiments and implementations, in no way restrictive, and of the appended drawings wherein.

DETAILED DESCRIPTION

Figure 1A:
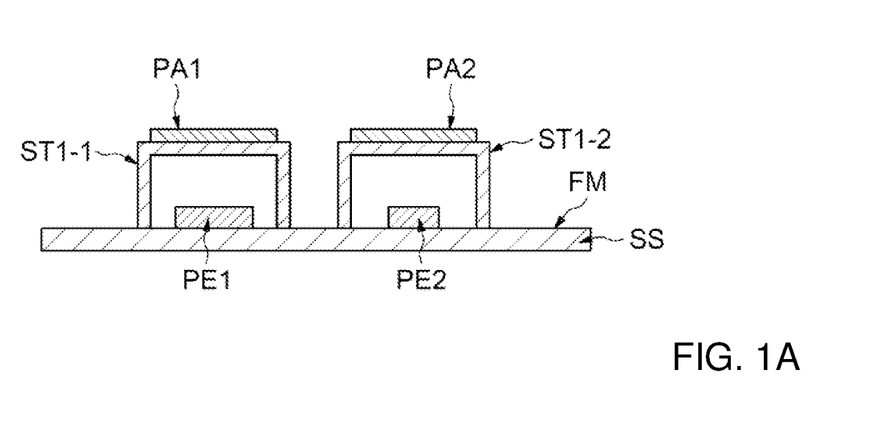
FIGS. 1A, 2A and 3A illustrate three embodiments of an electronic device.
Figure 2A:
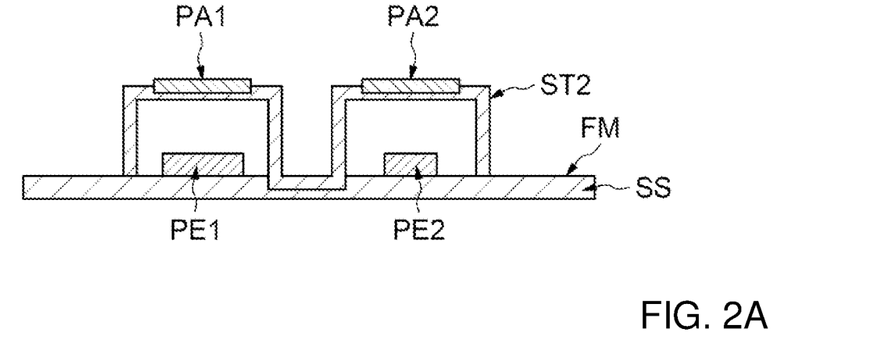
Figure 3A:
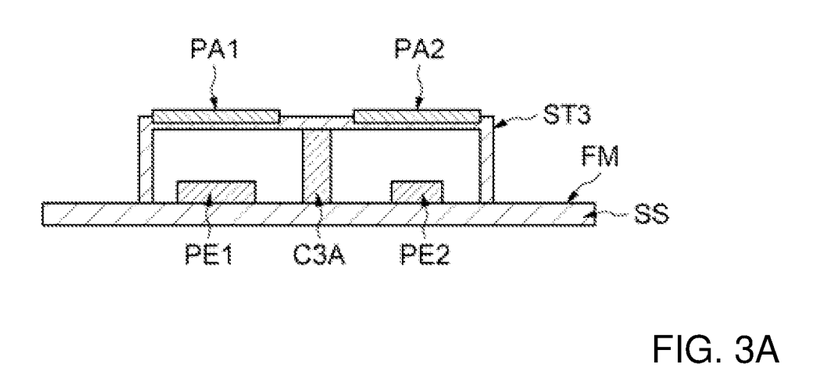

FIGS. 1A, 2A and 3A illustrate three embodiments of an electronic device including a base substrate SS including a mounting face FM, whereon electronic integrated circuit (IC) chips are mounted and electrically coupled to an interconnection network of the base substrate SS.

The base substrate includes a rear face, whereon metallic connections of the interconnection network are intended to connect the device with external equipment.

A transparent encapsulation structure is bonded onto the mounting face FM of the base substrate SS.

The encapsulation structure can, for example, be a part made of transparent plastic produced independently of the base substrate SS, for example with an injection molding technique.

The transparent encapsulation structure includes one or more transparent housings ST1-1, ST1-2, ST2, ST3, each having an internal cavity forming one or more chambers each intended to house one or more electronic chips PE1, PE2 integrating an optical element.

In this context, the phrase "chamber intended to house an electronic chip" denotes a free space capable of receiving the volume of at least one electronic chip.

This chamber is delimited on one hand by internal surfaces of the transparent housing and on the other by the mounting face of the base substrate SS. In other words, the chambers housing an electronic chip are optionally hermetic, enclosed free spaces, optionally filled with a quasi-vacuum atmosphere.

The transparent encapsulation structure is particularly intended to support light-filtering optical wafers PA1, PA2, positioned on external faces of the encapsulation structure facing each optical element of the electronic chips. These light-filtering optical wafers PA1, PA2 may, for example, have a square or rectangular shape in plan view (i.e., view looking towards the top surface of the transparent encapsulation structure.

In other words, the optical wafers PA1, PA2, are positioned such that light rays reaching each optical element are filtered beforehand by a respective optical wafer, and conversely such that rays emitted by each optical element are filtered by a respective optical wafer leaving the chamber housing this optical element.

The light-filtering optical wafers PA1, PA2, can advantageously be located in hollow recesses EV1, EV2 located on the external faces of the encapsulation structure.

Alternatively, the optical wafers PA1, PA2, can be disposed, for example bonded, on a planar external face of the encapsulation structure, facing the respective optical element.

According to different examples, the encapsulation structure can include one or more housings, each comprising a chamber each containing one or more electronic chips.

An encapsulation structure can, for example, comprise a single housing ST2 wherein a first chamber houses the first electronic chip PE1 and a second chamber houses the second electronic chip PE2.

Otherwise, an encapsulation structure can, for example, comprise a single housing ST3 wherein a single chamber houses the first electronic chip PE1 and a second electronic chip PE2.

Otherwise again, an encapsulation structure can, for example, comprise two independent housings, a first housing ST1-1 comprising a first chamber housing a first electronic chip PE1 and a second housing ST1-2 comprising a second chamber housing a second electronic chip PE2.

Each housing can have a shape, typically polyhedral, for example with a square or rectangular base. Obviously, other shapes can be envisaged for the housings, such as blocks with a trapezoidal base, or cylinders, each comprising an internal cavity defining a chamber suitable for housing at least one electronic chip PE1, PE2, an external face suitable for supporting an optical wafer PA1, PA2 and at least one open face whereof is bonded onto the mounting face FM of the base substrate SS FIGS. 1A, 2A and 3A illustrate more particularly an example of application of the "TOF" time-of-flight distance sensor wherein a first electronic chip PE1 and a second electronic chip PE2 operate in pairs. For example, the first electronic chip PE1 emits a signal intended to be reflected onto a surface external to the device then detected, following the reflection, by the second electronic chip PE2. The device can then determine the time elapsed between the emission and the reception of the signal, and therefore infer the distance separating the device and the external surface.

The first electronic chip PE1 then integrates an optical emitter, typically a laser diode, and the second electronic chip PE2 integrates an optical detector associated with the emitter, typically a photosensitive sensor.

FIG. 1A illustrates an embodiment wherein a transparent encapsulation structure includes a first housing ST1-1 and a second housing ST1-2 separated by a median space, and bonded onto the mounting face FM of the base substrate SS.

The median space is, for example, in this embodiment a space physically separating the first housing ST1-1 and the second housing ST1-2.

Typically, this median space is delimited by two opposite faces of the first and the second housing spaced by a distance of an order of magnitude of the order of 150 to 500 μm (micrometer).

Figure 1B:
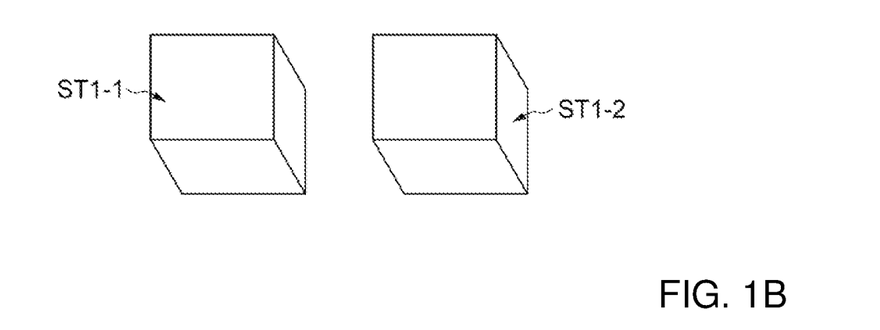
FIGS. 1B, 2B and 3B illustrate three-dimensional views of the transparent encapsulation structure.

FIG. 1B illustrates a three-dimensional view of the transparent encapsulation structure comprising the first housing ST1-1 and the second housing ST1-2, as described above with reference to FIG. 1A.

The first housing ST1-1 includes a first planar external face, forming the support of a first light-filtering optical wafer PAL The first external face, supporting the optical wafer PA1, is the face parallel with the mounting face FM of the base substrate SS, in order to dispose the first optical wafer PA1 facing the optical element of the first electronic chip PE1.

The second housing ST1-2 includes a second planar external face, forming the support of a second light-filtering optical wafer PA2. The second external face, supporting the optical wafer PA2, is also the face parallel with the mounting face FM of the base substrate SS, in order to dispose the second optical wafer PA2 facing the optical element of the second electronic chip PE2.

FIG. 2A illustrates a transparent encapsulation structure comprising a transparent housing ST2 including a first chamber and a second chamber, separated by a median space, and connected by a planar portion resting on the base substrate SS.

The first chamber houses the first electronic chip PE1 and the second chamber houses the second electronic chip PE2.

The planar portion of the transparent housing ST2 is advantageously positioned in a recess hollowed in the mounting face FM of the base substrate SS.

The recess hollowed in the substrate SS is sufficiently deep to entirely contain the planar portion of the transparent housing ST2 under the mounting face FM of the base substrate.

Thus, these arrangements make it possible to prevent the planar portion of the housing ST2 from forming a direct optical path between the optical element of the first electronic chip and the optical element of the second electronic chip.

Figure 2B:
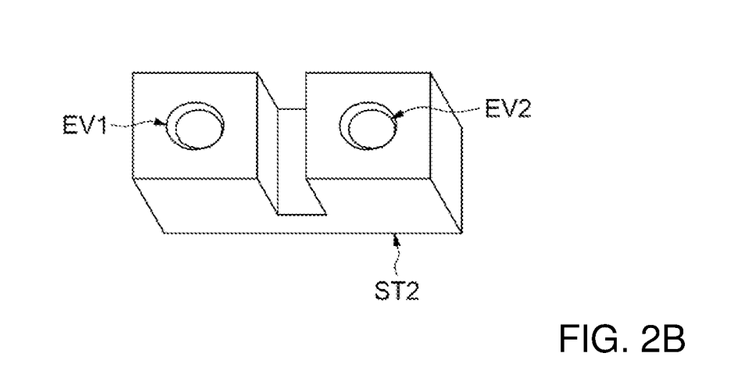

FIG. 2B illustrates a three-dimensional view of the transparent encapsulation structure comprising a transparent housing ST2 including two separated chambers connected by a planar portion, described with reference to FIG. 2A.

The housing has at least one open face bonded onto the mounting face FM of the base substrate SS.

The housing ST2 includes a first recess EV1 and a second recess EV2, each being located on an external face, respectively, of each chamber, parallel with the mounting face FM of the substrate. The first recess EV1 and the second recess EV2 are respectively positioned facing the optical elements of the first chip PE1 and the second chip PE2. The recesses are thus envisaged to receive the light-filtering optical wafers PA1, PA2 facing said optical elements.

FIG. 3A illustrates a transparent encapsulation structure comprising a transparent housing ST3 including an internal cavity forming a single chamber housing the first electronic chip PE1 and the second electronic chip PE2.

Inside the cavity, the first electronic chip PE1 and the second electronic chip PE2 are separated by an opaque adhesive volume C3A located in the single chamber between the first chip PE1 and the second chip PE2. The opaque adhesive volume C3A entirely prevents the transmission of direct light rays between the first electronic chip PE1 and the second electronic chip PE2.

Figure 3B:
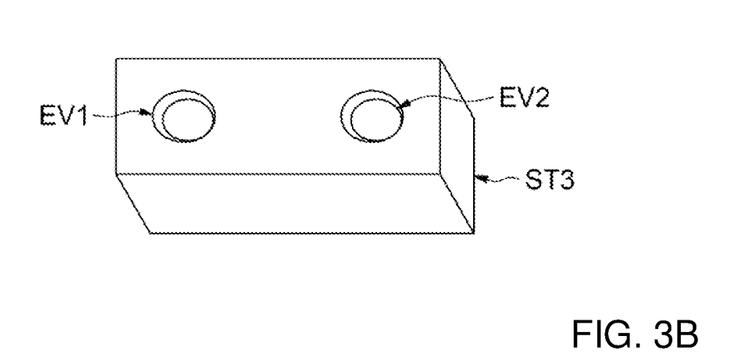

FIG. 3B illustrates a three-dimensional view of the transparent encapsulation structure comprising a transparent housing ST3 including an internal cavity forming a single chamber, described with reference to FIG. 3A.

The housing ST3 includes a first recess EV1 located on an external face of the housing facing the optical element of the first electronic chip PE1, and a second recess EV2 located on the external face of the housing facing the optical element of the second electronic chip PE2.

Figure 4A:
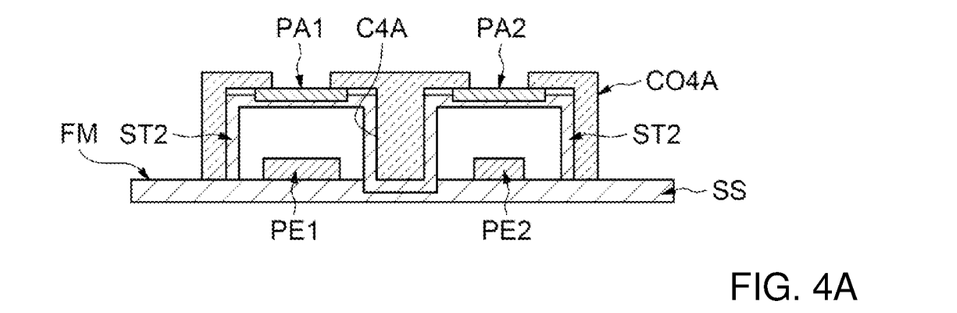
FIGS. 4A, 4B and 4C illustrate embodiments of opaque covers.
Figure 4B:
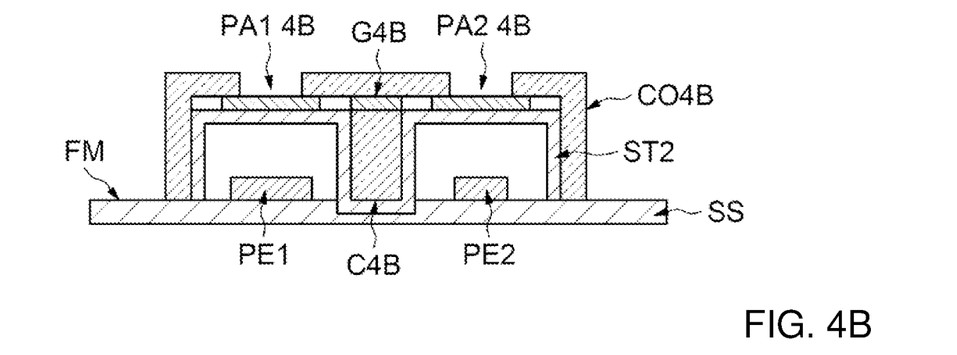
Figure 4C:
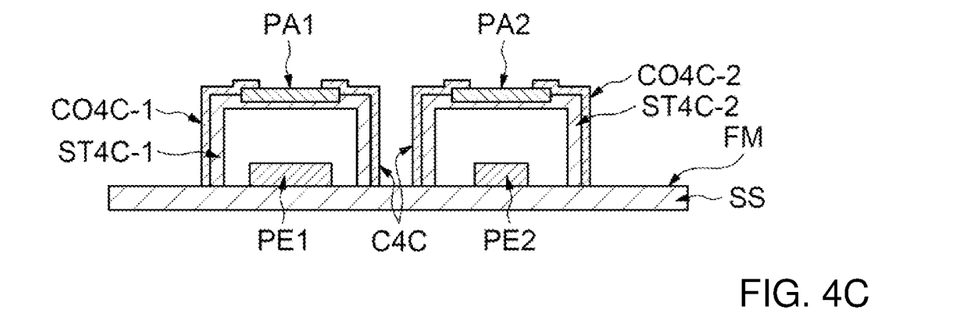

FIGS. 4A, 4B and 4C illustrate embodiments of opaque covers CO4A, CO4B, CO4C-1, CO4C-2, covering a transparent encapsulation structure and opaque partitions C4A, C4B, C4C between the first chamber and the second chamber of the transparent encapsulation structure.

The opaque partition C4A, C4B, C4C blocks direct optical paths between the first optical element of the first electronic chip PE1 housed in the first chamber and the second optical element of the second electronic chip PE2 housed in the second chamber.

In the case of an application of the "TOF" time-of-flight sensor type, the opaque partitions make it possible to prevent a parasitic detection by the receiver optical element of a signal emitted by the emitter optical element, and which would not have been reflected by an external surface for which it is sought to determine a presence.

Furthermore, each opaque cover CO4A, CO4B, CO4C-1, CO4C-2, has local openings disposed facing optical wafers PA1, PA2, supported by the transparent encapsulation structure.

In the embodiment examples in FIGS. 4A and 4B, the transparent encapsulation structure ST2 is chosen arbitrarily according to the embodiment example described above with reference to FIGS. 2A and 2B.

FIG. 4A illustrates an opaque cover CO4A with an opaque partition C4A inserted into the median space located between the first and the second chamber. In this example, the opaque partition C4A is a member of (i.e., it is integral with) the opaque cover CO4A.

FIG. 4B illustrates an opaque partition C4B formed in the median space located between the first and the second chamber. The opaque cover CO4B is bonded onto a top face of the opaque partition C4B, as well as on the mounting face FM of the substrate SS.

The opaque partition CO4B is formed in the median space and molds to the walls of the encapsulation structure, which thus makes it possible to adapt the formation of the opaque partition C4A to any specific shape of the encapsulation structure, and prevent any alignment problems of the opaque partition in the median space, with respect to the positioning of the cover.

Obviously, the embodiment examples in FIGS. 4A and 4B could perfectly be applied in the embodiment example of the transparent encapsulation structure described above with reference to FIGS. 1A and 1B.

FIG. 4C illustrates an opaque cover CO4C-1, CO4C-2, formed by a sputtering of opaque material along the contours of the transparent encapsulation structure. In this example, the encapsulation structure is formed by two independent housings ST4C-1, ST4C-2, as described above with reference to FIGS. 1A and 1B.

Given that the opaque cover CO4C-1 CO4C-2 is formed by a sputtering of opaque material, it molds to the walls of the encapsulation structure including two housings, particularly at the level of a median space between the first and the second chamber.

The opaque cover CO4C-1 CO4C-2 formed by the sputtering of material places an opaque covering on all of the external faces of the two independent housings ST4C-1, ST4C-2, thus making it possible to prevent a direct optical path from being formed between the first chamber and the second chamber. The opaque partition C4C is formed from the same material and is entirely rigidly connected to the opaque cover CO4C-1 CO4C-2.

This embodiment example of opaque cover CO4C-1, CO4C-2, can obviously be applied to the transparent encapsulation structure embodiment examples described with reference to FIGS. 2A, 2B, 3A and 3B.

Figure 5:
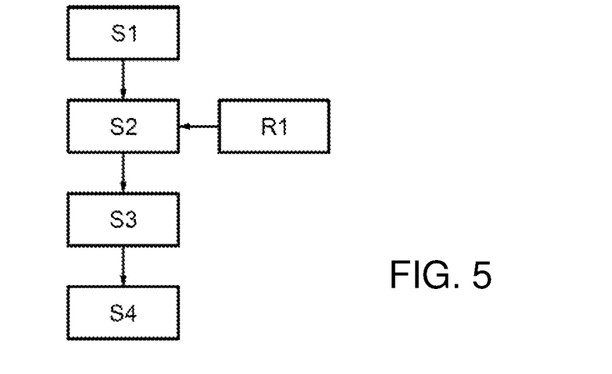
FIG. 5 is a flow diagram.

FIG. 5 illustrates steps of producing, or assembling, an electronic device as described above with reference to FIGS. 1A to 4C.

During a step R1 prior to assembling the electronic device, a transparent encapsulation structure as described above with reference to FIGS. 1A to 3B is produced. For example, the production of the transparent encapsulation structure comprises an injection of a transparent plastic material into a mold provided for this purpose.

A first step S1 comprises fastening electronic chips integrating an optical element onto a mounting face of a base substrate.

The fastening of the electronic chips typically comprises a soldering of solder balls envisaged on the electronic chip with the solder surfaces of the base substrate receiving the balls, or indeed a bonding of the electronic chips and an electrical connection of the electronic chips with solder wires pulled between solder plates of the chip and solder surfaces of the base substrate.

In a second step S2, a transparent encapsulation structure including one or more chambers on the mounting face FM of the substrate is bonded, such that each chamber of the encapsulation structure houses an electronic chip.

During a third step S3, a light-filtering optical wafer PA1, PA2 is mounted on the transparent encapsulation structure facing each optical element. For example, the optical wafers are wedged and/or bonded in a hollowed front recess located on an external face of the encapsulation structure, or bonded onto a planar external face of the encapsulation structure.

A fourth step S4 consists of covering the encapsulation structure with an opaque cover such that local openings of the opaque cover are located facing each optical element and opaque partitions are placed between the chambers of the same encapsulation structure.

To produce a device as described with reference to FIG. 4B, the step S4 comprises placing an opaque partition C4B in a median space between the first and the second chamber of the same housing ST2, then disposing an adhesive volume G4B on a top surface of the opaque partition C4B, and finally covering the encapsulation structure and the top structure of the opaque partition C4B by the opaque cover CO4B.

To produce a device as described with reference to FIG. 4C, the step S4 comprises sputtering an opaque material CO4C-1, CO4C-2 such that the external faces of the encapsulation structure are covered with the same opaque material, thus forming at the same time the opaque cover CO4C-1, CO4C-2 and the opaque partition C4C.

The invention claimed is:

1. An electronic device, comprising:
   a base substrate having a mounting face;
   at least one electronic chip having a rear face fastened onto the mounting face of the base substrate and a front face integrating an optical element;
   a transparent encapsulation structure bonded onto the base substrate, said transparent encapsulation structure comprising at least one housing including an internal cavity forming a chamber delimited by the mounting face and internal surfaces of the transparent encapsulation structure, wherein said internal surfaces are spaced from said at least one electronic chip to form an enclosed free space within which the at least one electronic chip is located;
   a light-filtering optical wafer supported by and located on an external face of the encapsulation structure and facing each optical element; and
   an opaque cover covering the transparent encapsulation structure and the light-filtering optical wafer, said opaque cover including a local opening exposing at least a portion of the light-filtering optical wafer.

2. The device according to claim 1, wherein the transparent encapsulation structure is provided with a hollowed front recess located on said external face of the encapsulation structure facing each optical element, wherein the light-filtering optical wafer is mounted within said hollowed front recess.

3. The device according to claim 1, wherein said at least one electronic chip includes a first electronic chip and a second electronic chip, and further including an opaque partition located between the first electronic chip and the second electronic chip.

4. The device according to claim 3, wherein said at least one housing is formed by a single transparent housing defining a single chamber housing both the first electronic chip and the second electronic chip, and wherein the opaque partition comprises an opaque volume located inside the single chamber.

5. The device according to claim 4, wherein the opaque volume is made of an adhesive material.

6. The device according to claim 3, wherein said at least one housing includes a first transparent housing defining a first chamber housing the first electronic chip and a second transparent housing defining a second chamber housing the second electronic chip, and wherein the opaque partition occupies a median space outside the first and second chambers positioned between the first chamber and the second chamber.

7. The device according to claim 3, wherein said at least one housing includes a single transparent housing defining a first chamber housing the first electronic chip and a second chamber housing the second electronic chip, and wherein the opaque partition occupies a median space outside the first and second chambers positioned between the first chamber and the second chamber.

8. The device according to claim 7, wherein the single transparent housing comprise a planar portion connecting the first and second chambers and resting on the base substrate.

9. The device according to claim 8, wherein the base substrate includes a recess hollowed in the mounting face of the base substrate, and wherein said planar portion of the single transparent housing is mounted within said recess.

10. The device according to claim 7, wherein the opaque cover incorporates the opaque partition in the median space.

11. The device according to claim 7, wherein the opaque partition completely fills the median space.

12. The device according to claim 11, wherein the opaque cover is bonded to a free top face of the opaque partition.

13. The device according to claim 7, wherein the opaque cover and the opaque partition are made of an opaque material sputtered onto the external faces of the transparent encapsulation structure.

14. The device according to claim 3, wherein the optical element integrated in the first electronic chip includes a radiation emitter and wherein the optical element integrated in the second electronic chip includes a radiation receiver configured to receive radiation emitted by the radiation emitter after reflection from an element external to said opaque cover.

15. A method for producing an electronic device, comprising:
    fastening a rear face of at least one electronic chip onto a mounting face of a base substrate, said at least one electronic chip integrating an optical element on a front face;
    bonding a transparent encapsulation structure on the mounting face of the substrate, said transparent encapsulation structure comprising at least one housing including an internal cavity forming a chamber delimited by the mounting face and internal surfaces of the transparent encapsulation structure, wherein said internal surfaces are spaced from said at least one electronic chip to form an enclosed free space within which the at least one electronic chip is located;
    mounting a light-filtering optical wafer onto the transparent encapsulation structure facing each optical element; and
    mounting an opaque cover covering the transparent encapsulation structure and the light-filtering optical wafer, said opaque cover including a local opening exposing at least a portion of the light-filtering optical wafer.

16. The method according to claim 15, wherein mounting the light-filtering optical wafer comprises mounting the light-filtering optical wafer in a hollowed front recess located on an external face of the transparent encapsulation structure facing the optical element.

17. The method according to claim 15, wherein said at least one electronic chip includes a first electronic chip and a second electronic chip, and wherein bonding the transparent encapsulation structure comprising placing an opaque partition between the first electronic chip and the second electronic chip.

18. The method according to claim 17, wherein said at least one housing includes a single housing defining a single chamber, wherein bonding the transparent encapsulation structure comprises housing the first electronic chip and the second electronic chip in the single chamber, and wherein placing the opaque partition comprises forming an opaque volume between the first electronic chip and the second electronic chip.

19. The method according to claim 17, wherein said at least one housing includes a first transparent housing defining a first chamber and a second transparent housing defining a second chamber, wherein bonding the transparent encapsulation structure comprises arranging the first housing and the second housing so as to house the first electronic chip in the first chamber and house the second electronic chip in the second chamber, and wherein forming an opaque volume comprises forming said opaque volume in a median space outside the first and second chambers that spaces the first chamber from the second chamber.

20. The method according to claim 17, wherein said at least one housing includes a single transparent housing defining a first chamber and a second chamber with a median space outside the first and second chambers spacing the first chamber from the second chamber, and wherein forming an opaque volume comprises forming said opaque volume in the median space.

21. The method according to claim 20, where said at least one housing includes a planar portion connecting the first and second chambers, wherein bonding the transparent encapsulation structure comprises mounting the planar portion on the base substrate.

22. The method according to claim 21, further including:
forming a hollow recess in the mounting face of the base substrate; and
positioning the planar portion in the hollow recess of the mounting face.

23. The method according to claim 17, wherein placing the opaque partition comprises incorporating said opaque partition in the opaque cover.

24. The method according to claim 17, wherein placing the opaque partition comprises filling the median space between the first chamber and the second chamber with an opaque material, followed by bonding of the opaque cover onto a free top face of the opaque partition.

25. The method according to claim 15, wherein mounting of the opaque cover on the transparent encapsulation structure and placing of the opaque partition comprise sputtering an opaque material onto the external faces of the transparent encapsulation structure.

26. The method according to claim 15, wherein the optical element integrated in the first electronic chip includes a radiation emitter and the optical element integrated in the second electronic chip includes a radiation receiver configured to receive radiation emitted by the radiation emitter after reflection by an element external to said opaque cover.

* * * * *